United States Patent [19]
Saito et al.

[11] Patent Number: 4,996,005
[45] Date of Patent: Feb. 26, 1991

[54] CONDUCTIVE COMPOSITION AND METHOD FOR MANUFACTURING PRINTED CIRCUIT SUBSTRATE

[75] Inventors: Mitsuru Saito; Satoru Matsumora; Yasushi Watanabe, all of Miyagi, Japan

[73] Assignee: Alps Electric Co., Ltd., Tokyo, Japan

[21] Appl. No.: 204,439

[22] Filed: Jun. 9, 1988

[30] Foreign Application Priority Data

Sep. 25, 1987 [JP] Japan .............................. 62-241309

[51] Int. Cl.$^5$ ............................................. H01B 1/06
[52] U.S. Cl. .................................. 252/512; 252/513; 252/514; 523/457; 523/458; 523/459
[58] Field of Search ....................... 252/512, 514, 513; 523/457-459

[56] References Cited

U.S. PATENT DOCUMENTS

| | | | |
|---|---|---|---|
| 3,194,860 | 7/1965 | Ehneich et al. | 252/511 |
| 3,202,488 | 8/1965 | Ehneich et al. | 252/514 |
| 3,547,835 | 3/1971 | Voorhees et al. | 252/514 |
| 3,583,930 | 12/1980 | Kawasumi et al. | 427/216 |
| 4,309,457 | 1/1982 | Kawasumi et al. | 427/216 |
| 4,716,081 | 12/1987 | Ehneich | 252/512 |

*Primary Examiner*—Josephine Barr
*Attorney, Agent, or Firm*—Guy W. Shoup; David W. Heid

[57] ABSTRACT

A conductive composition comprising conductive particles made of a mechanical composite powder of copper or nickel covered with silver and a binder mainly containing bis-phenol A type epoxy resin (diglycidyl ether of bisphenol A) having 1600 to 5500 of molecular weight method for manufacturing a printed circuit substrate comprising the steps of printing the conductive composition on an insulating substrate and partially curing it in a range of 20 to 70% of completion as determined from DTA reactivity data. Thus, the conductive composition can manufacture an inexpensive circuit in simple steps as a whole with good solderability using low melting point solder and having high bonding strength. The method can manufacture the circuit by using the same conductive composition.

16 Claims, No Drawings

CONDUCTIVE COMPOSITION AND METHOD FOR MANUFACTURING PRINTED CIRCUIT SUBSTRATE

BACKGROUND OF THE INVENTION

1. Field of the Invention

This invention relates to a conductive composition for use in the formation of a printed circuit and a method for manufacturing a circuit using the conductive composition, more particularly, this invention relates to a conductive composition and a method for manufacturing a printed circuit substrate using the conductive composition which is therefore solderable.

2. Description of the Prior Art

Heretofore, a circuit substrate which can be directly soldered is obtained by etching a copper foil bonded to an insulating substrate or by printing and sintering paste which contains conductive particles of silver, platinum or palladium and fritted glass on an insulating substrate.

However, soldering a copper foil has disadvantages which tend to complicate the process steps, because etching is required and the copper foil is wasted by the etching process. Soldering a sintered paste of silver, platinum or palladium on an insulating substrate has drawbacks because the insulating substrate on which the circuit is formed is an expensive ceramic which can withstand the high sintering temperatures of 600°–900° C. Moreover, the ceramic substrates are mechanically easily damaged during the sintering process. Furthermore, the sintering equipment is sizeable and expensive.

The conventional technology has produced a conductive composition to form a circuit which can be soldered with less expensive material and in simpler steps. Since paste-like conductive composition that contain synthetic resin which can be cured at relatively low temperature is heretofore used as a binder to form a printed circuit, the production of a composition which can be soldered has been attempted on the basis of the conductive composition. As an example, conductive paste in which silver powder is dispersed in epoxy resin or conductive paste in which copper powder is dispersed in phenol resin is printed and baked on a synthetic resin laminated board has been conventionally used.

However, since the above-described conventional conductive composition is covered on the surface of a coating film with the resin so that the ratio of conductive particles to be exposed on the surface is small and the area to be contacted with the solder is small, the conventional conductive composition has a drawback that the bonding strength of the coating film to the solder is weak. Further, the quantity of the conductive particles is increased to increase the bonding strength to the solder, but since the quantity of the resin is decreased, there arises new drawback that the bonding strength between the insulating substrate and the coating film is deteriorated. Moreover, a low melting point solder exhibits worse solderability and is not practical. When silver powder is used as conductive particles, the silver powder is diffused in the solder, decreasing bondability of the soldered silver to the substrate (so-called "silver diffusion" occurs). Since the silver is expensive, the material costs are increased also. When copper powder is used as the conductive particles, the surfaces of the copper powder particles are oxidized thereby decreasing solderability.

SUMMARY OF THE INVENTION

Accordingly, an object of this invention is to provide a conductive composition which eliminates the above-mentioned drawbacks and can manufacture an inexpensive circuit in simple steps as a whole with good solderability using low melting point solders and having high bonding strength to an insulating substrate while using synthetic resin as a binder and a method for manufacturing a circuit using the same.

In order to achieve the above and other objects of the invention, there is provided according to the present invention a conductive composition comprising conductive particles made of mechanical composite powder of copper or nickel and silver and a binder mainly containing bis-phenol A type epoxy resin (deglycidyl ether of bisphenol A) having 1600 to 5500 of molecular weight and a method for manufacturing a printed circuit substrate comprising the steps of printing the conductive composition on an insulating substrate and partially curing it to 20 to 70% of completion as determined from DTA reactivity data.

DESCRIPTION OF THE PREFERRED EMBODIMENT

A conductive composition of the present invention is manufactured by the steps of dispersing mechanical composite powder of copper or nickel particles, which have ball mill coated with silver flakes in a binder resin which mainly contains bis-phenol A type epoxy resin (diglycidyl ether of bisphenol A), adding a solvent for adjusting its viscosity and adding a general coating film modifier and an additive for improving printability thereto.

The mechanical composite powder is produced by colliding copper or nickel particles and flake-like silver particles forcibly in a ball mill to cause press-bonding of the silver particles on the surfaces of the copper or nickel particles. The features of bonding strength between the copper or nickel particles with the silver particles is stronger than that of a coating by an electroless plating method and the surfaces of the copper or nickel particles are hardly oxidized in this process.

In, the configuration of the present invention, the conductive particles are formed by covering the surfaces of the copper or nickel particles with the silver which is intended to utilize the features of each component and to eliminate the disadvantages of each individually as described in the prior art.

Copper or nickel oxidizes over time. The oxidation prevents solder from properly wetting to the copper or nickel surface. Poor wettability results in poor solderability. When silver particles are used, silver diffuses into the solder and the circuit film becomes mostly resin with little silver. This causes poor bondability between the circuit film and the solder.

The mixture ratio of the copper or nickel to the silver is in a range of 20:80 to 60:40 by volume in practice, and 50:50 is particularly preferable. If the ratio of the silver is increased from this range, the quantity of the silver used is increased to raise the material cost, while if the ratio of the silver is decreased from this range, coating of the surface of the copper or nickel becomes insufficient so that their surfaces are oxidized and therefore the solder does not wet well to the oxidized surface.

The binder of this invention employs bis-phenol A type epoxy resin (diglycidyl ether of bisphenol A) which contains a range of 1600 to 550 of molecular weight. The most proper molecular weight is selected according to the mixture ratio of the conductive particles, and curing conditions.

The hardener to be employed includes aromatic diamine or imidazoles. More specifically, preferable cured material is provided by using aromatic diamines such as diaminodiphenolsulfon, diaminodiphenylmethane, 2-ethyl-4-methylimidazole.

A general coating film modifier, and a printability improving agent are added to the above-mentioned conductive particles, resin binder and, curing agent, to be added to manufacture a printing conductive composition paste.

A, a method for forming a circuit with the above-mentioned conductive composition is described below.

The conductive composition described in the present invention is screen printed to form a circuit-like layer. Then, it is heated, dried and the resin starts curing. At this time, the curing step is not completed. The cure process is stopped in a range of 20 to 70% of completion as determined from DTA reactivity data. Heating conditions for stopping the cure process at this point are different and depend on the molecular weight of the resin and the mixture ratio of the conductive particles optimum conditions are obtainable experimentally. The conductive composition, once partially cured, is sufficiently in a hardened solderable state. Once the soldering process has begun, the resin will partially melt due to the heat of the solder during the soldering process, the conductive particles in a range of sufficient area are exposed by the partial melting and contacted with the solder.

Then, an example of the present invention will be described by way of illustration.

The materials and the mixture ratio of the conductive composition are as below.

| | |
|---|---|
| Copper-silver mechanical powder (Copper-silver wt. ratio: 50:50) | 102.9 parts by weight or 10.592 parts by volume |
| Bis-phenol A type epoxy resin (diglycidylether of bisphenol A) (Epikote produced by Yuka Shell Co., Ltd.) | 13.6 parts by weight or 11.624 parts by volume |
| Diaminodiphenylsulfon | Equivalent by weight or 0.769 parts by volume |
| Carbitol acetate | 19.3 parts by weight. |

The above materials were kneaded and dispersed by a three roll mill. The produced conductive composition became paste-like and adapted for printing.

A method for manufacturing a circuit using the present invention is described below.

The conductive composition of the present invention was printed by screen printing in a circuit-like state on a phenol laminated board. The board was heated at 160° C. for 10 min. The conductive composition was partially cured to 45% of its total cure as determined by DTA reactivity data.

Then, flexible circuit board manufactured under the above-mentioned conditions was soldered. The solder employed was a low melting point solder. A cream solder having a 99° C. solid phase point and 139° C. liquid phase point was dispersed in a flux and printed on the circuit using a metal mask of 0.3 mm of thickness. The board was heated preliminarily at 100° C., then heated to a 160° C. peak temperature for 3 min, wherein the solder reflowed. As a result, the surface of the circuit layer was uniformed covered with the solder.

When the solder used on the circuit formed with the conductive composition and the method for manufacturing the circuit according to the present invention was compared with the solder coating on the circuit using the conductive composition with conventional resin binder, the solder coating of the present invention was excellent.

According to the present invention as described above, the conductive particles are formed of the mechanical composite powder of the copper or nickel and the silver. Therefore, the composition is not effected by the influence of the diffusion of the silver to the solder with inexpensive cost and excellent solderability. Since the conductive composition of the invention uses the binder which mainly contains bis-phenol A type epoxy resin (diglycidyl ether of bisphenol A) of 1600 to 5500 of molecular weight, the conductive particles are exposed due to the melting movement due to the heat of the solder even after curing, and the circuit surface is uniformly covered with the solder. Since the step of semicuring is provided in the process of curing, further uniform solderability is provided. Sufficient solderability can be provided even if the conductive composition of the inexpensive resin binder is used, thereby providing various effects in practice.

What is claimed is:

1. A conductive composition comprising:
   conductive particles which comprise copper, wherein said copper particles are coated with particles of silver, said silver particles being present in an amount at least to coat said copper particles sufficiently to minimize oxidation of said copper;
   a binder which comprises diglycidyl ether of bisphenol A epoxy resin, wherein said binder has a molecular weight of from 1,600 to 5,500, said binder being present in said composition in a ratio to said conductive particles capable of at least dispersing said conductive particles before said binder is cured; and
   a hardener selected from the group consisting of diaminodiphenolsulfon, diaminodiphenylmethane, and 2-ethyl-4-methylimidazole, wherein said hardener is present in an amount sufficient to cause said binder to cure.

2. A conductive composition according to claim 1, wherein a solids content range of said conductive particles to said conductive particles plus said binder is 40 to 55% by volume.

3. A conductive composition according to claim 2, wherein said amount of said copper particles to said amount of said silver particles is in a ratio of from 20:80 to 60:40 by volume.

4. A conductive composition according to claim 3, wherein said ratio of said copper particles to said silver particles is 50:50 by volume.

5. A conductive composition according to claim 4, wherein said silver particles are press-bonded to said copper particles.

6. A conductive composition according to claim 1, wherein said amount of said nickel particles to said amount of said silver particles is in a ratio of from 20:80 to 60:40 by volume.

7. A conductive composition according to claim 6, wherein said ratio of said nickel particles to said silver particles is 50:50 by volume.

8. A conductive composition according to claim 7, wherein said silver particles are press-bonded to said nickel particles.

9. A conductive composition according to claim 8, wherein a solids content range of said conductive particles to said conductive particles plus said binder is 40 to 55% by volume.

10. A conductive composition comprising:

conductive particles which comprise nickel, wherein said nickel particles are coated with particles of silver, said silver particles being present in an amount at least to coat said nickel particles sufficiently to minimize oxidation of said nickel;

a binder which comprises diglycidyl ether of bisphenol A epoxy resin, wherein said binder has a molecular weight of from 1,600 to 5,500, said binder being present in said composition in a ratio to said conductive particles capable of at least dispersing said conductive particles before said binder is cured; and a hardener selected from the group consisting of diaminodiphenolsulfon, diaminodiphenylmethane, and 2-ethyl-4-methylimidazole, wherein said hardener is present in an amount sufficient to cause said binder to cure.

11. A conductive composition comprising:

conductive particles which comprise copper, wherein said copper particles are coated with particles of silver, said copper particles being mixed in a ratio to said silver particles ranging from 20:80 to 60:40 by volume;

a binder which comprises diglycidyl ether of bisphenol A epoxy resin, wherein said binder has a molecular weight of from 1,600 to 5,500, wherein said conductive particles to said conductive particles plus said binder is provided in a range of 40 to 55% by volume in solids content; and a hardener selected from the group consisting of diaminodiphenolsulfon, diaminodiphenylmethane, and 2-ethyl-4-methylimidazole, wherein said hardener is present in an amount sufficient to cause said binder to cure.

12. A conductive composition according to claim 11, wherein said ratio of said copper particles to said silver particles is 50:50 by volume.

13. A conductive composition according to claim 12, wherein said silver particles are press-bonded to said copper particles.

14. A conductive composition comprising:

conductive particles which comprise nickel, wherein said nickel particles are coated with particles of silver, said nickel particles being mixed in a ratio to said silver particles ranging from 20:80 to 60:40 by volume;

a binder which comprises diglycidyl ether of bisphenol A epoxy resin, wherein said binder has a molecular weight of from 1,600 to 5,500, wherein said conductive particles to said conductive particles plus said binder is provided in a range of 40 to 55% by volume in solids content; and a hardener selected from the group consisting of diaminodiphenolsulfon, diaminodiphenylmethane, and 2-ethyl-4-methylimidazole, wherein said hardener is present in an amount sufficient to cause said binder to cure.

15. A conductive composition according to claim 14, wherein said ratio of said nickel particles to said silver particles is 50:50 by volume.

16. A conductive composition according to claim 15, wherein said silver particles are press-bonded to said nickel particles.

* * * * *

UNITED STATES PATENT AND TRADEMARK OFFICE
CERTIFICATE OF CORRECTION

PATENT NO.   :   4,996,005
DATED        :   February 26, 1991
INVENTOR(S)  :   Mitsuru Saito et al.

It is certified that error appears in the above-identified patent and that said Letters Patent is hereby corrected as shown below:

TITLE PAGE:
    In the Abstract, line 6, after "weight" insert
-- is described.  A --.

Signed and Sealed this

Twenty-second Day of September, 1992

*Attest:*

DOUGLAS B. COMER

*Attesting Officer*        Acting Commissioner of Patents and Trademarks